(12) United States Patent
Shi et al.

(10) Patent No.: US 8,288,808 B2
(45) Date of Patent: Oct. 16, 2012

(54) MULTI-CASCADED PHOTODIODE

(75) Inventors: Jin-Wei Shi, Taipei (TW); Feng-Ming Kuo, Kaohsiung County (TW)

(73) Assignee: National Central University, Jhongli, Taoyuan (TW)

( * ) Notice: Subject to any disclaimer, the term of this patent is extended or adjusted under 35 U.S.C. 154(b) by 159 days.

(21) Appl. No.: 12/957,607

(22) Filed: Dec. 1, 2010

(65) Prior Publication Data

US 2011/0309459 A1     Dec. 22, 2011

(30) Foreign Application Priority Data

Jun. 17, 2010   (TW) .................................. 099119631

(51) Int. Cl.
*H01L 31/062*     (2006.01)
*H01L 31/113*     (2006.01)

(52) U.S. Cl. ................. 257/291; 257/293; 257/E31.115; 250/214.1

(58) Field of Classification Search ................... 257/290, 257/291, 292, 293, 431, E31.115; 250/214.1
See application file for complete search history.

(56) References Cited

U.S. PATENT DOCUMENTS 5,451,767 A * 9/1995 Amano et al. ............. 250/214.1
* cited by examiner

*Primary Examiner* — Hoai V Pham
(74) *Attorney, Agent, or Firm* — Jackson IPG PLLC

(57) ABSTRACT

The present disclosure uses at least two cascaded photodetectors. Device area is increased to provide a bigger current than a single photodetector under the same bandwidth. Hence, bandwidth efficiency (BRP) and saturation current-bandwidth product (SCBP) are improved for a high speed, a high responsivity and a high bandwidth with simple structure and low cost.

4 Claims, 7 Drawing Sheets

MULTI-CASCADED PHOTODIODE

TECHNICAL FIELD OF THE DISCLOSURE

The present disclosure relates to a diode device; more particularly, relates to using at least two cascaded photodetectors to provide a bigger current than a single photodetector under the same bandwidth by increasing device area for improving bandwidth efficiency (BRP) and saturation current-bandwidth product (SCBP) to obtain a high speed, a high responsivity and a high bandwidth with simple structure and low cost.

DESCRIPTION OF THE RELATED ARTS

In a millimeter-wave (MMW) over fiber communication system, a high-speed high-power photodetector (PD) plays an important role, where a strong optical power is transformed into a high MMW power. Saturation current-bandwidth product (SCBP) is an important index for evaluating a high-power photodetector used in a radio-over-fiber (ROF) communication system, especially when operated in a 100 GHz, or even higher, frequency. Under such a high frequency, an excellent low-cost MMW power amplifier for improving signals sending from an output of an optoelectronic device is still a challenge. For increasing an output saturation current of the photodetector and further enhancing a biggest usable MMW power to release loading of the MMW power amplifier, an optical input power can be increased. The key for obtaining the final high SCBP is to decrease an area of an active photo-absorption layer and a thickness of a depletion layer. A thinner depletion layer will have a shorter carrier transmission time and a higher output saturation current with the junction capacitance increased. For obtaining a lower junction capacitance, a reduced active area is required to maintain a high speed. However, saturation current of the photodetector is seriously limited by its tiny area (about 10 $\mu m^2$) owing to device heating and parasitic resistance. By minimizing the photodetector, its load resistance is reduced to 25 or 12.5 ohms ($\Omega$) to achieve super-high speed (about 300 GHz). Yet, its photo-generated MMW power will be reduced 3 dB and 6 dB for 25$\Omega$ and 12.5$\Omega$, respectively.

Another solution is to use electron to reduce carrier drift time in an epi-layer structure of photodiode. Uni-traveling-carrier photodiode (UTC-PD) has excellent SCBP. Under a 25$\Omega$ load, the UTC-PD has an optical-to-electrical (OE) 3 dB bandwidth for 170 GHz and a biggest output photocurrent about 14 mA for a 13 $\mu m^2$ active area, whose SCBP is 2380 mA-GHz. Or, under a continuous wave having a heterodyne-beating of 50 GHz and 50 mA, a 2500 mA-GHz SCBP is obtained. However, with such a high output photocurrent, a very high reverse bias may be required for UTC-PD; and, saturation on electron drift speed may limit SCBP by the reverse bias. Another solution for enhancing SCBP of photodetector is to use a traveling-wave (TW) structure in a distributed way. UTC-PD (1938 mA-GHz, 17 GHz, 114 mA) and P-I-N photodetector (1760 mA-GHz, 80 GHz, 22 mA) have good SCBPs. They expand an optical absorption layer in the TW structure to uniformly distribute photocurrent for binding several minimized photodetectors with a low-loss electrical transmission line. But, in the TW structure, the velocity injected optical wave must match with phase wave of photo-generated electrical wave carefully, so that a largest OE frequency response must be obtained through a precise tuning and a complex electrical or optical design becomes a must. Besides, 50$\Omega$ dummy load in input end is a reflective electrical wave to be absorbed; and, thus, effective load resistance of the TW structure is about 25$\Omega$.

As shown in FIG. 6 and FIG. 7, a general single NBUTC-PD 600 comprises an indium phosphide (InP) based photodetector bonded with a substrate; three metal strips 6 as coplanar waveguide (CPW); and a 25$\Omega$ load 70, where the photodetector is connected between an input and an output of the load 70. On using, an inlet light 61 enters the photodetector 60 to be transformed into a photocurrent in the load 70. Under a 25$\Omega$ load, the NBUTC-PD has a 110 GHz OE bandwidth and a biggest output photocurrent about 37 mA for an active area reduced to 289 $\mu m^2$ (whose SCBP is 4070 mA-GHz). In the other hand, an InP photodetector having a 25$\Omega$ load is used, whose SCBP is 1938 mA-GHz or 1760 mA-GHz for a continuous wave of heterodyne-beating of (17 GHz and 114 mA) or (80 GHz and 22 mA) measured from a parallel-fed traveling wave PD.

Hence, the prior arts do not fulfill all users' requests on actual use.

SUMMARY OF THE DISCLOSURE

The main purpose of the present disclosure is to use at least two cascaded photodetectors to provide a bigger current than a single photodetector under the same bandwidth by increasing device area for improving bandwidth efficiency (BRP) and saturation current-bandwidth product (SCBP) to obtain a high speed, a high saturation power and a high bandwidth with simple structure and low cost.

The second purpose of the present disclosure is to use linear cascaded NBUTC-PDs flip-chip bonded with an AlN substrate as a heat sink for improving RC-limited bandwidth to obtain a biggest OE frequency response with reduced cost.

To achieve the above purposes, the present disclosure is a multi-cascaded photodiode structure, comprising an optical splitting device, a photodetector module, and a load, where the optical splitting device reflects an inlet light to be split into a plurality of light beams; where the photodetector module comprises a plurality of photodetectors; where the plurality of photodetectors is connected between an input and an output of the load; and where each photodetector is shined by one light beam split from the inlet light to obtain a photocurrent signal for driving the load. Accordingly, a novel multi-cascaded optical diode device is obtained.

BRIEF DESCRIPTIONS OF THE DRAWINGS

The present disclosure will be better understood from the following detailed description of the preferred embodiment according to the present disclosure, taken in conjunction with the accompanying drawings, in which FIG. 1 is the structural view showing the preferred embodiment according to the present disclosure;

DESCRIPTION OF THE PREFERRED EMBODIMENT

The following description of the preferred embodiment is provided to understand the features and the structures of the present disclosure.

Figure 1:
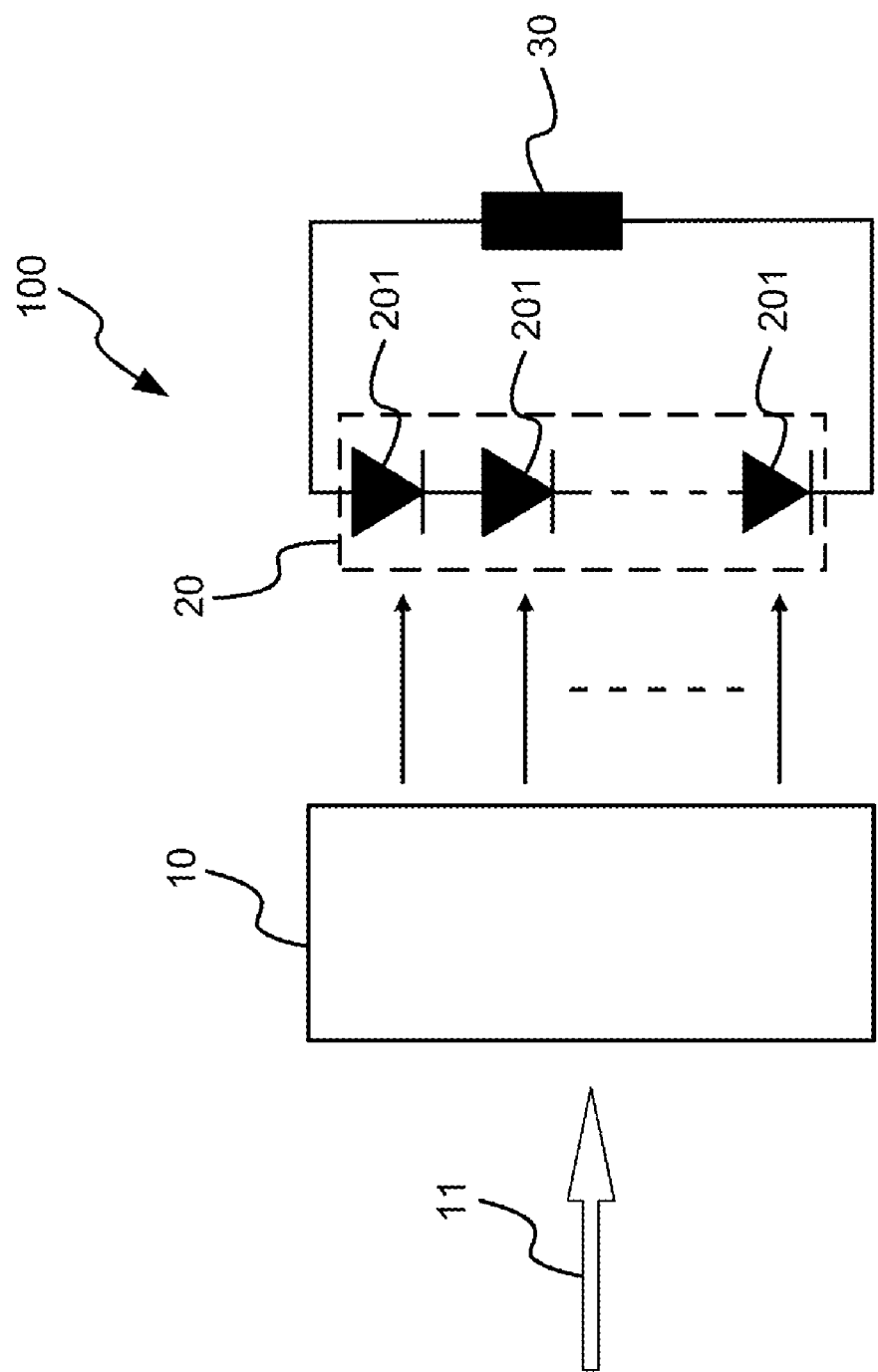

Please refer to FIG. 1, which is a structural view showing a preferred embodiment according to the present disclosure. As shown in the figure, the present disclosure is a multi-cascaded optical diode device 100, comprising an optical splitting device 10, a photodetector module 20 and a load 30, where the photodetector module 20 comprises a plurality of photodetectors 201 to be connected between an input and an output of the load 30.

The optical splitting device 10 is used to split an inlet light 11 into a plurality of light beams; thus, the inlet light 11 shines on each of the photodetectors 201 to excite a photocurrent signal for driving the load 30. Therein, the photodetector module 20 comprises at least two photodetectors 201 and the photodetector 201 is a near-ballistic uni-traveling-carrier photodiode (NBUTC-PD).

Figure 2:
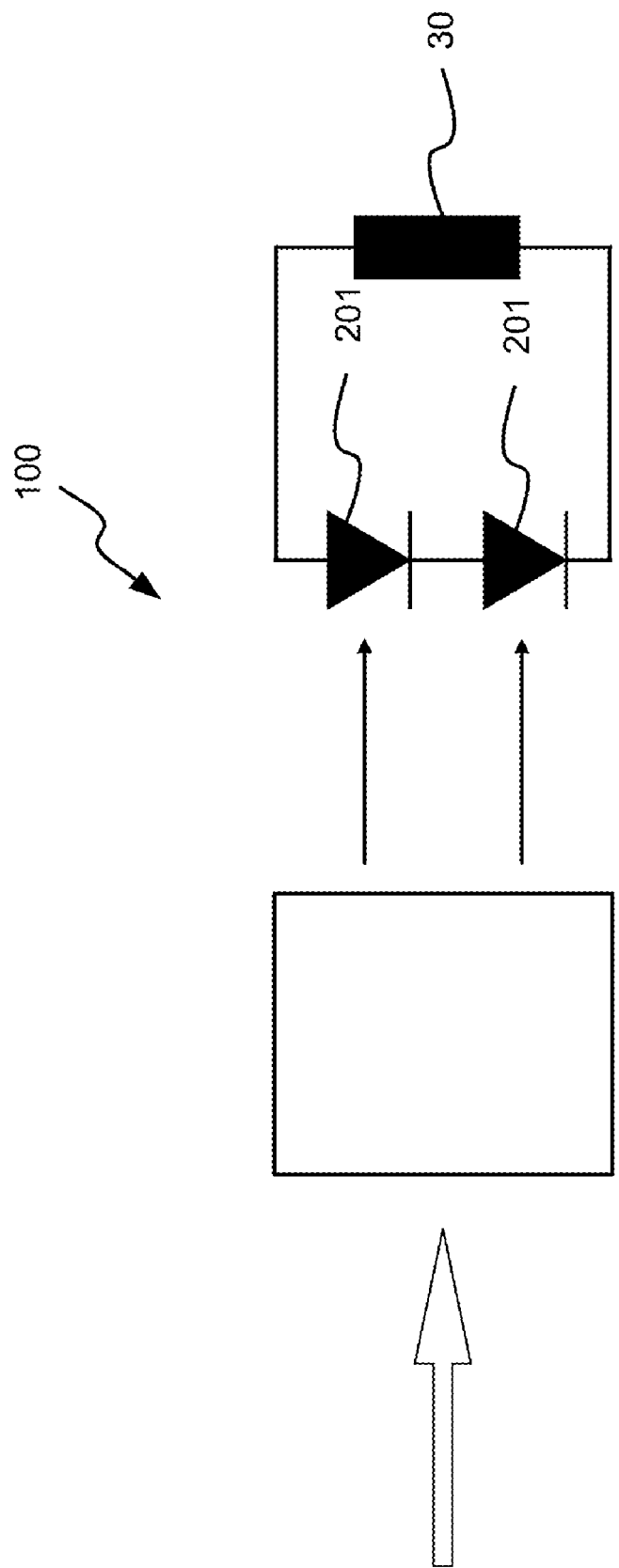
FIG. 2 is the structural view showing the two linear-cascaded NBUTC-PDs.
Figure 3:
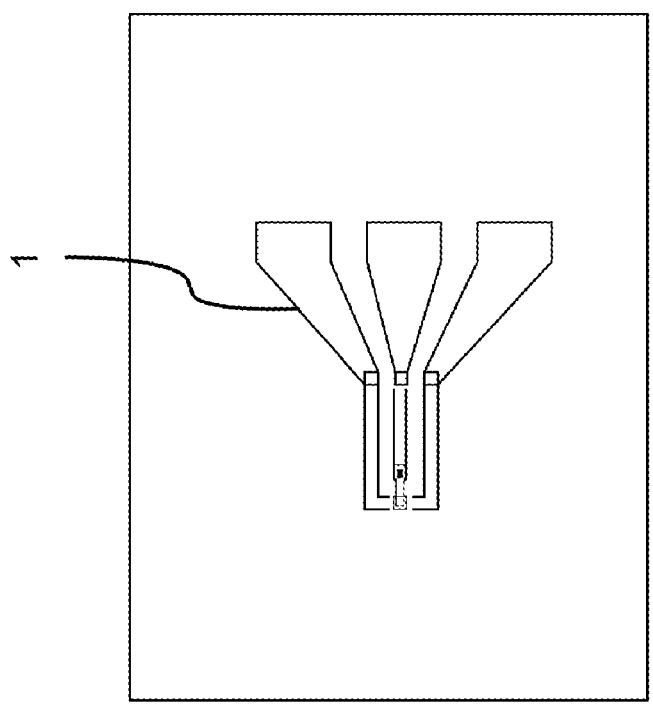
FIG. 3 is the top-downward view showing the two linear-cascaded NBUTC-PDs.

Please refer to FIG. 2 and FIG. 3, which are a structural view showing two linear-cascaded NBUTC-PDs; and a top-downward view showing two linear-cascaded NBUTC-PDs. As shown in the figures, on using the present disclosure, two linear-cascaded NBUTC-PDs are used in the preferred embodiment 100. The preferred embodiment 100 comprises two photodetectors 201 with an aluminum nitride (AlN) substrate flip-chip bonded as a heat sink for high thermal conductivity and low dielectric loss; three metal strips 1 as co-planar waveguide (CPW); and a load 300 having a resistance of 50 ohms ($\Omega$), where total active area is 578 square micrometers ($\mu m^2$).

The present disclosure has serially connected photodetectors. Although parasitic resistance is increased and junction capacitance is reduced by increasing number of the photodetectors, the increased parasitic resistance is very small to a degree to be ignored and so the present disclosure can effectively reduce capacitance without increasing resistance.

Figure 4:
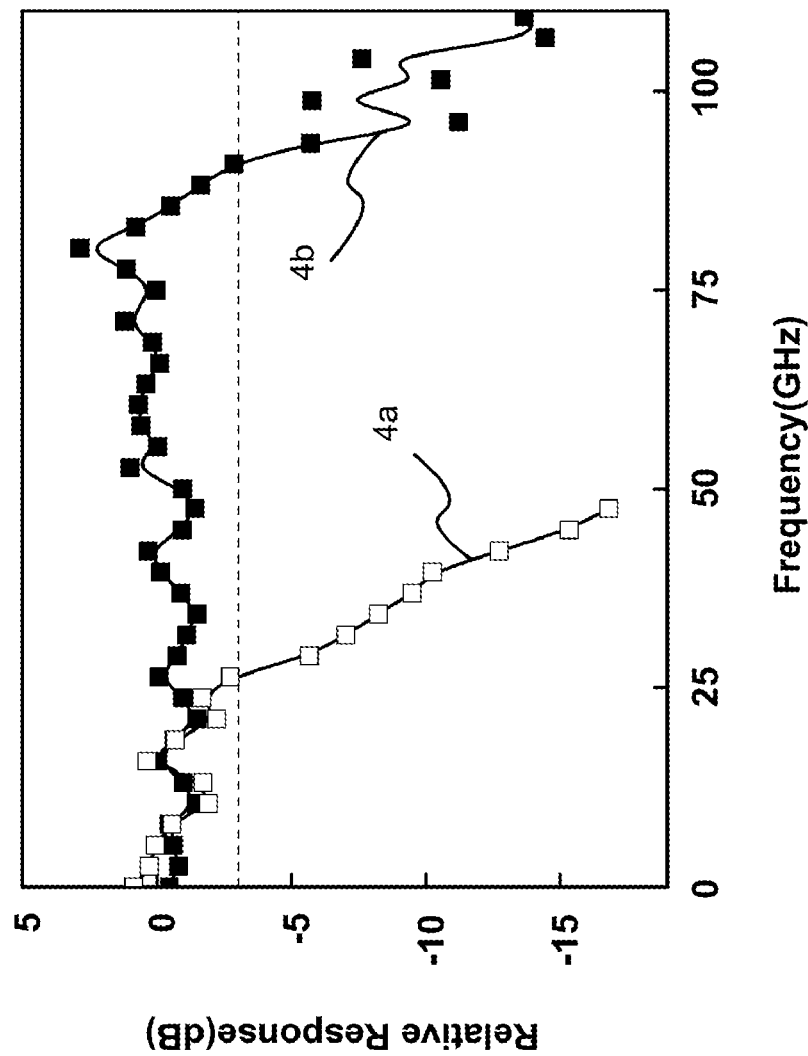
FIG. 4 is the view showing the OE frequency response.
Figure 5:
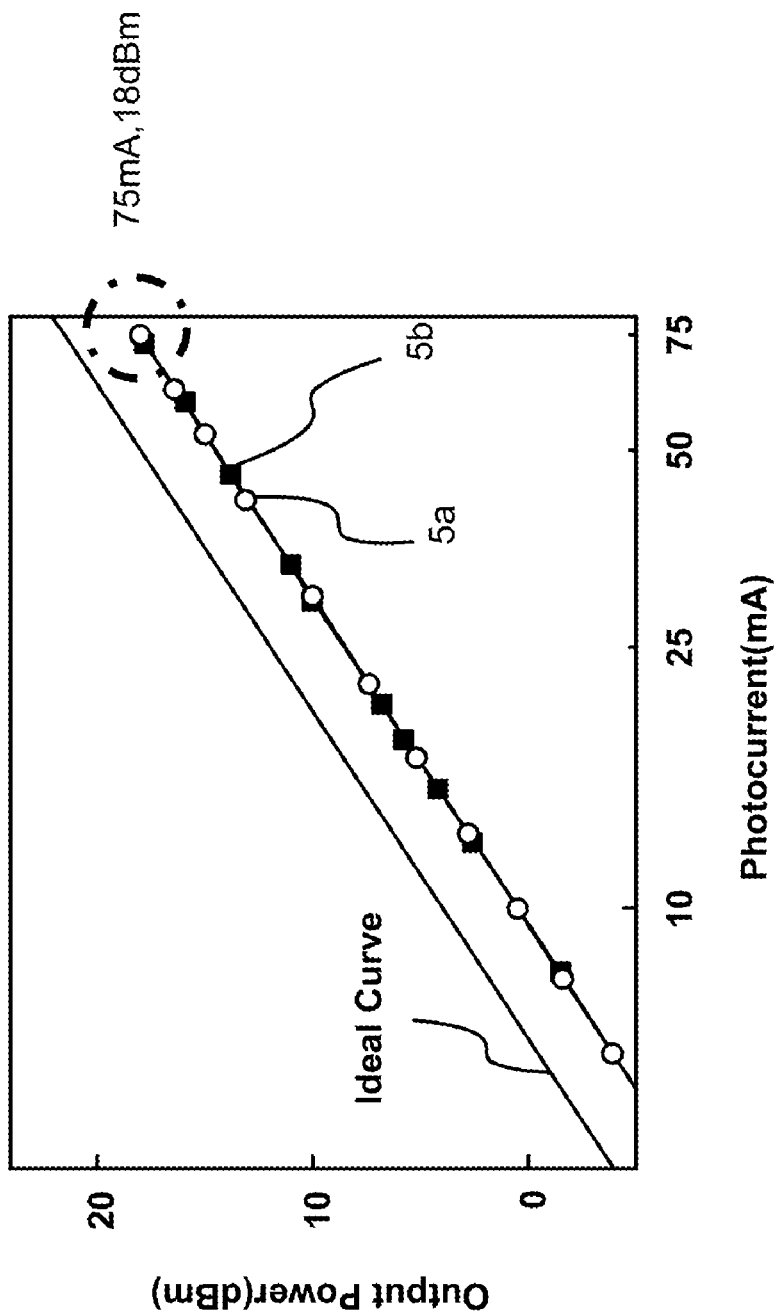
FIG. 5 is the view showing the greatest output power to output photocurrent.
Figure 6:
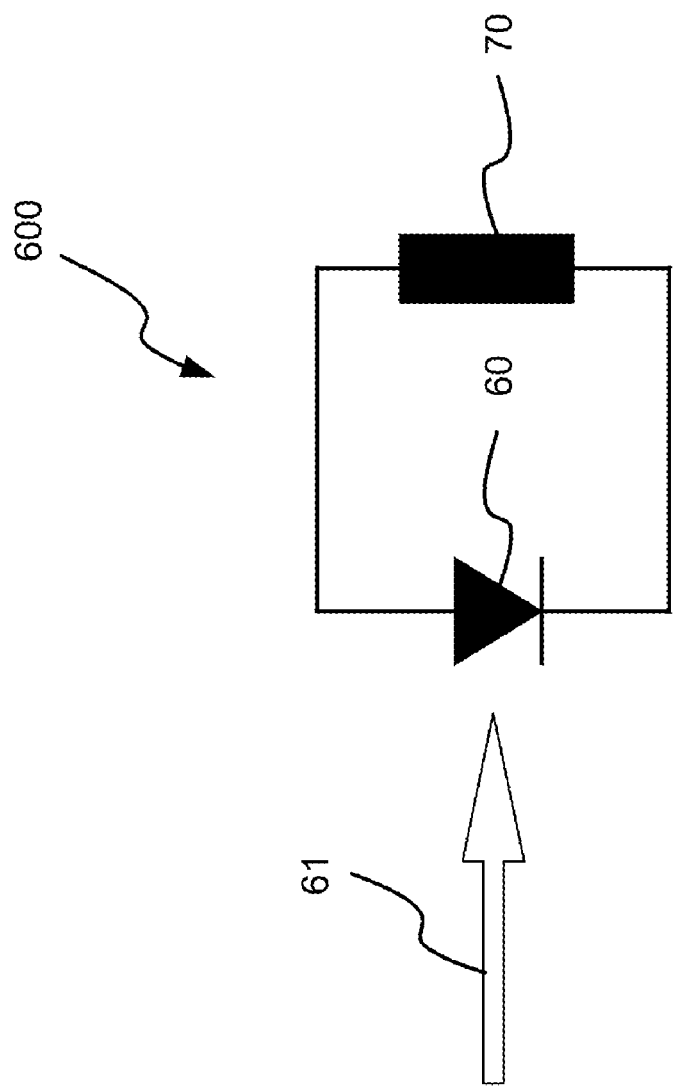
FIG. 6 is the structural view of the traditional NBUTC photodetector.
Figure 7:
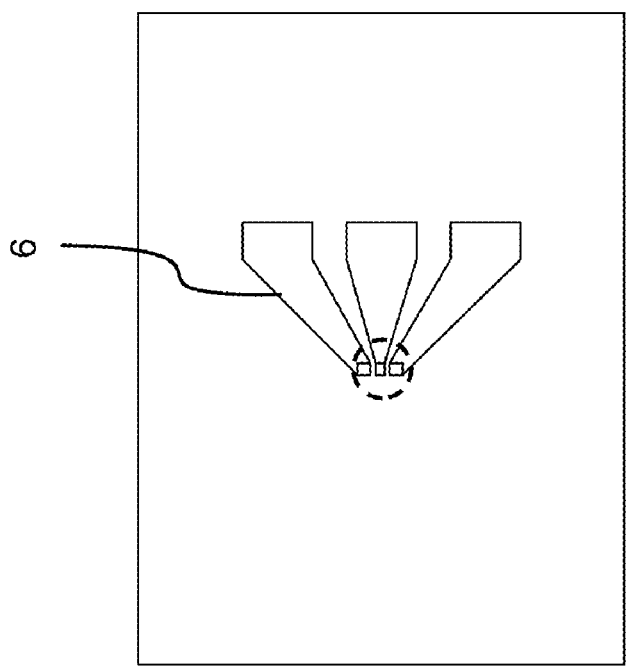
FIG. 7 is the top-downward view of the traditional NBUTC photodetector.

Please refer to FIG. 4 and FIG. 5, which are a view showing optical-to-electrical (OE) frequency response and a view showing greatest output power to output photocurrent. As shown in the figures, a set of two linearly cascaded NBUTC photodetectors is used with optical alignment easily. Optical power on the photodetector set is kept the same for a greatest response, where an enhanced resistance-capacitance-limited (RC-limited) bandwidth is obtained. On using the present disclosure, a direct current (DC) responsivity of the photodetector set is controlled under 0.12 A/W. For obtaining OE frequency response and output power, a two-laser heterodyne beating system and three different millimeter-wave (MMW) power sensors are used, which has a DC frequency until 50 giga-hertz (GHz), a V-band between 50 and 75 GHz and a W-band between 75 and 110 GHz.

In FIG. 4, OE frequency response curves under −3V and −6V bias for a single photodetector and a dual cascaded photodetector module 4a,4b are shown. Since RC-limited bandwidth is enhanced, the dual cascaded photodetector module reaches 91 GHz even with a big active area of 578 $\mu m^2$, which is three times higher than 27 GHz for the single photodetector with an active area of 289 $\mu m^2$. Conclusively, the cascaded structure used in the present disclosure has a 1.7 times greater bandwidth-responsivity product (BRP) than the single structure.

In FIG. 5, optical power-to-current curves under −5V and −10V bias for a single photodetector and a dual cascaded photodetector module 4a,4b are shown. Operational frequencies for the single photodetector and the dual cascaded photodetector module lie in 27 and 91 GHz, where saturation currents are both 75 milli-ampere (mA). Although bias required for the cascaded photodetector module is 2 times higher than that required for the single photodetector, active area (289 $\mu m^2$) for the cascaded module is also 2 times larger than that (578 $\mu m^2$) for the single photodetector to obtain the same saturation currents for both structures (75 mA, 18 dBm). As being operated under a room temperature, the present disclosure has a 3.4 times higher saturation current-bandwidth product (SCBP) than the single photodetector, which is 6825 mA-GHz with a 500 load (91 GHz, >75 mA). Hence, the present disclosure has great improvements on BRP and SCBP.

Thus, the present disclosure uses linear cascaded NBUTC-PDs flip-chip bonded with an AlN substrate as a heat sink for improving RC-limited bandwidth to obtain a biggest OE frequency response with reduced cost.

To sum up, the present disclosure is a multi-cascaded optical diode device, where at least two cascaded photodetectors are used to provide a bigger current than a single photodetector under the same bandwidth by increasing device area for improving BRP and SCBP to obtain a high speed, a high responsivity and a high bandwidth with simple structure and low cost.

The preferred embodiment(s) herein disclosed is(are) not intended to unnecessarily limit the scope of the disclosure. Therefore, simple modifications or variations belonging to the equivalent of the scope of the claims and the instructions disclosed herein for a patent are all within the scope of the present disclosure.

What is claimed is:

1. A multi-cascaded optical diode device, comprising
   an optical splitting device, said optical splitting device reflecting an inlet light to be split into a plurality of light beams;
   a photodetector module, said photodetector module comprising a plurality of photodetectors; and
   a load,
   wherein said plurality of photodetectors is connected between an input of said load and an output of said load; and
   wherein each of said photodetectors is shined by one of said light beams split from said inlet light to obtain a photocurrent signal to drive said load.

2. The device according to claim 1,
   wherein said photodetector is a near-ballistic uni-traveling-carrier photodiode (NBUTC-PD).

3. The device according to claim 1,
   wherein said photodetector module comprises at least two photodetectors.

4. The device according to claim 1,
   wherein said load has a resistance of 50 ohms ($\Omega$).

* * * * *